United States Patent [19]
Kirkman

[11] Patent Number: 5,992,012
[45] Date of Patent: Nov. 30, 1999

[54] METHOD FOR MAKING ELECTRICAL INTERCONNECTIONS BETWEEN LAYERS OF AN IC PACKAGE

[75] Inventor: Scott Kirkman, Redwood City, Calif.

[73] Assignee: LSI Logic Corporation, Milpitas, Calif.

[21] Appl. No.: 08/971,769

[22] Filed: Nov. 17, 1997

[51] Int. Cl.⁶ ....................................................... H05K 3/36
[52] U.S. Cl. ............................ 29/830; 29/852; 430/312; 430/313; 430/314
[58] Field of Search .............................. 29/852, 849, 825, 29/830; 430/312, 313, 314

[56] References Cited

U.S. PATENT DOCUMENTS

| | | |
|---|---|---|
| 4,566,186 | 1/1986 | Bauer et al. . |
| 4,642,889 | 2/1987 | Grabbe . |
| 4,643,935 | 2/1987 | McNeal et al. . |
| 4,648,179 | 3/1987 | Bhattacharyya et al. . |
| 5,679,498 | 10/1997 | Greenwood et al. . |

Primary Examiner—Carl J. Arbes

[57] ABSTRACT

In the manufacture of Printed Circuit (PC) boards, conductors are placed in a base layer of glass cloth. The conductors penetrate the thickness of the cloth and can be arranged to form a matrix or grid. The arrangement of cloth and conductors is then cured with resin with the wire lengths disposed within the cured board core. The wire lengths can be made flush with the board core surfaces and become the electrical conductors between circuitry on such surfaces. In one embodiment, the wire is removed leaving a finished hole ready for standard through-hole plating. These finished circuit boards can be stacked and laminated forming through, blind, or buried vias. One or more finished circuit boards with imbedded vias can be used as circuitry redistribution layers to avoid dense circuit patterns in applications such as in flip-chip mounting of integrated circuit chips. In another embodiment, the conductors are imbedded in the glass cloth with sufficient density to form a composite thick conductor. Other layers can then be laminated or built up on this composite and multiple vias can then be formed to the thick conductor using conventional techniques.

19 Claims, 5 Drawing Sheets

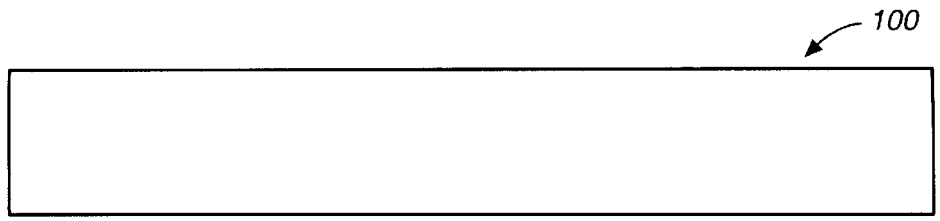
FIG._1A
(PRIOR ART)
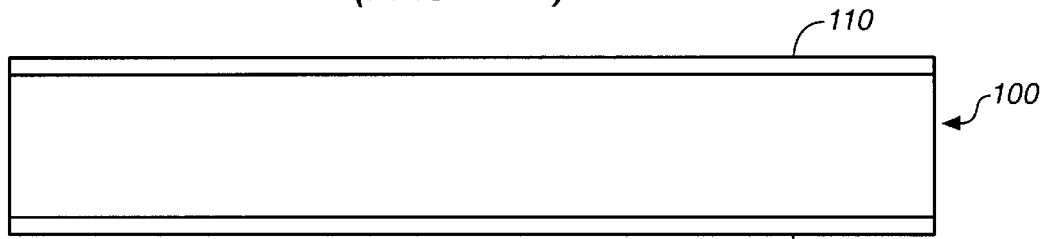
FIG._1B
(PRIOR ART)
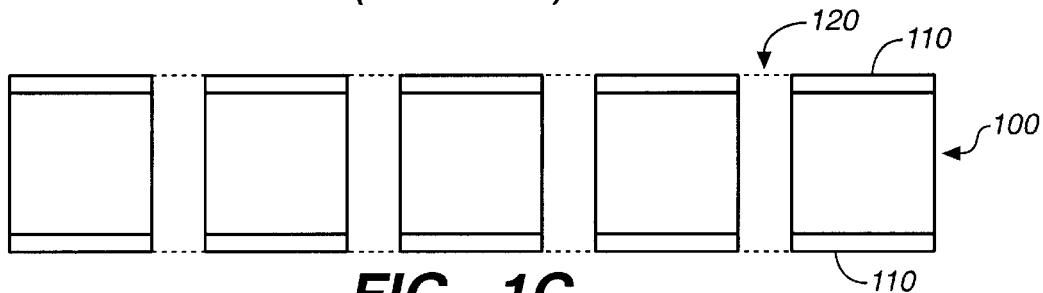
FIG._1C
(PRIOR ART)
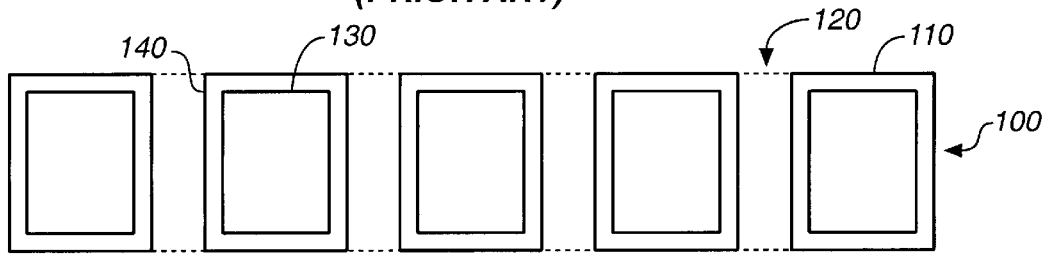
FIG._1D
(PRIOR ART)
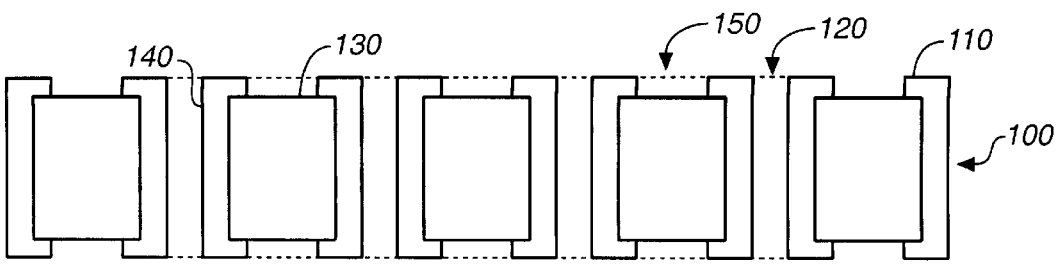
FIG._1E
(PRIOR ART)

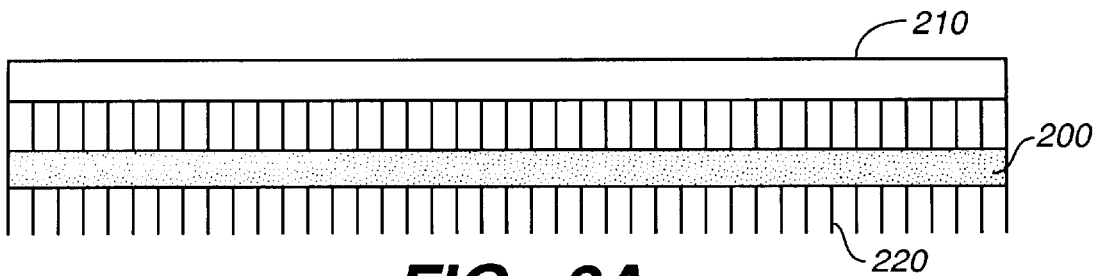
FIG._2A
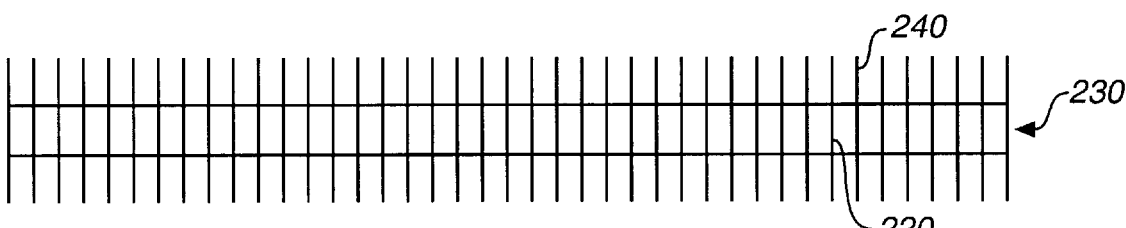
FIG._2B
FIG._2C
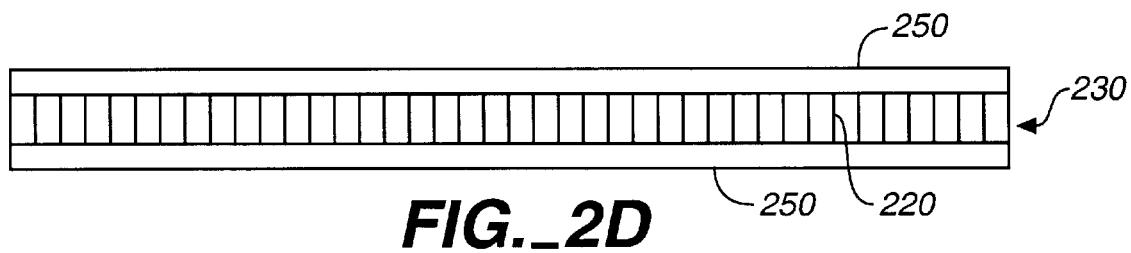
FIG._2D
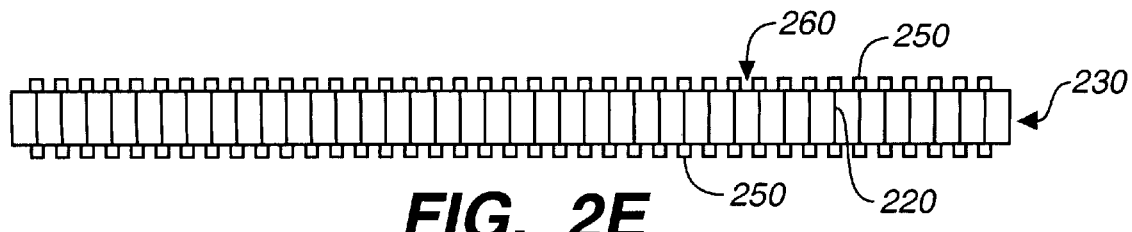
FIG._2E

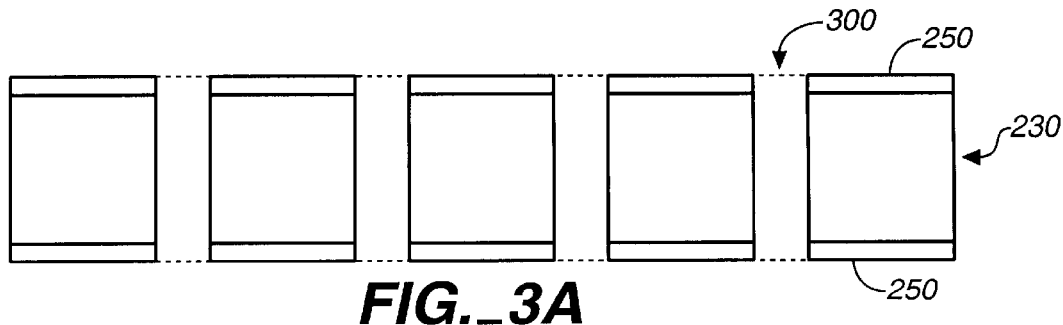
FIG._3A
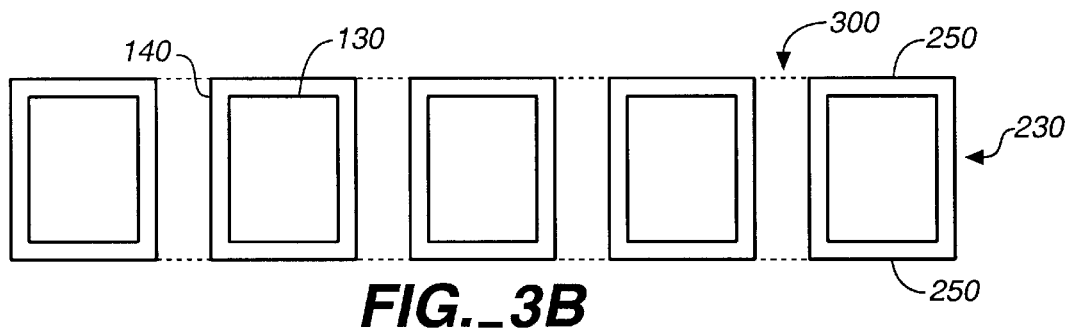
FIG._3B
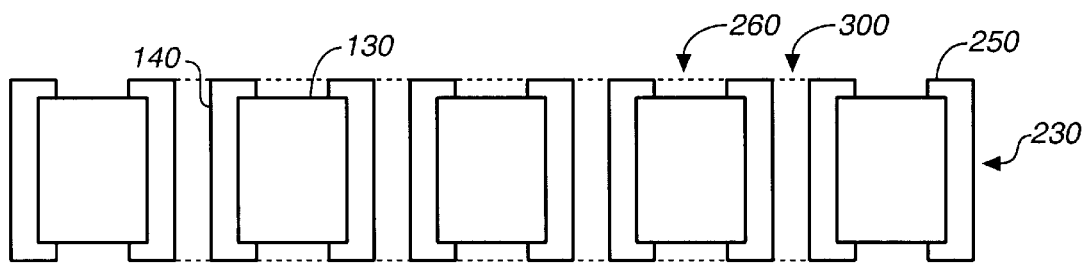
FIG._3C
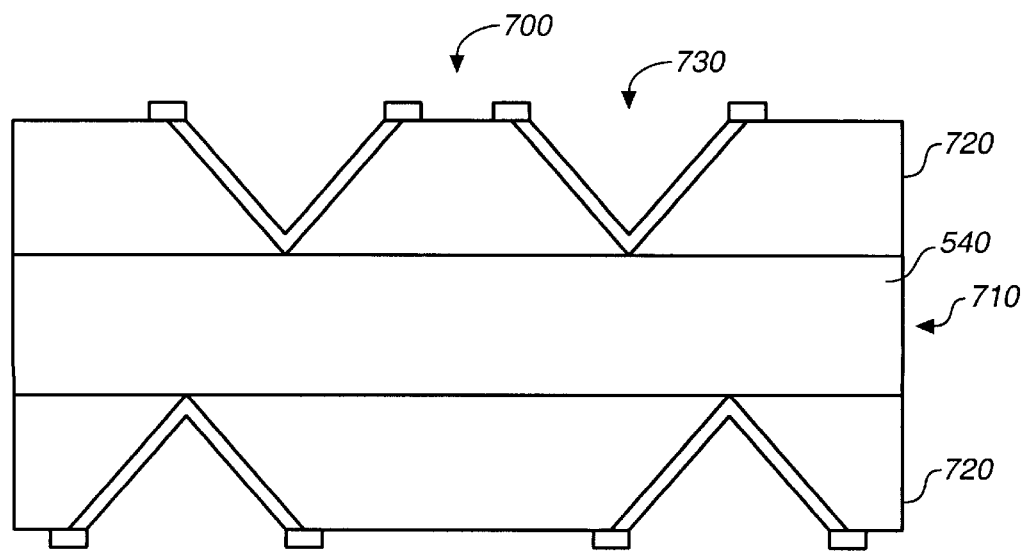
FIG._7

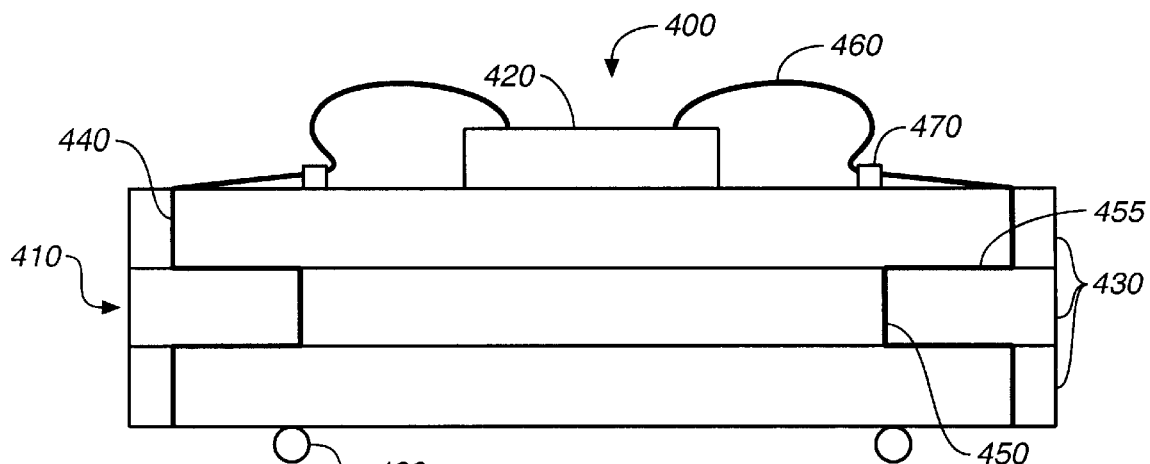

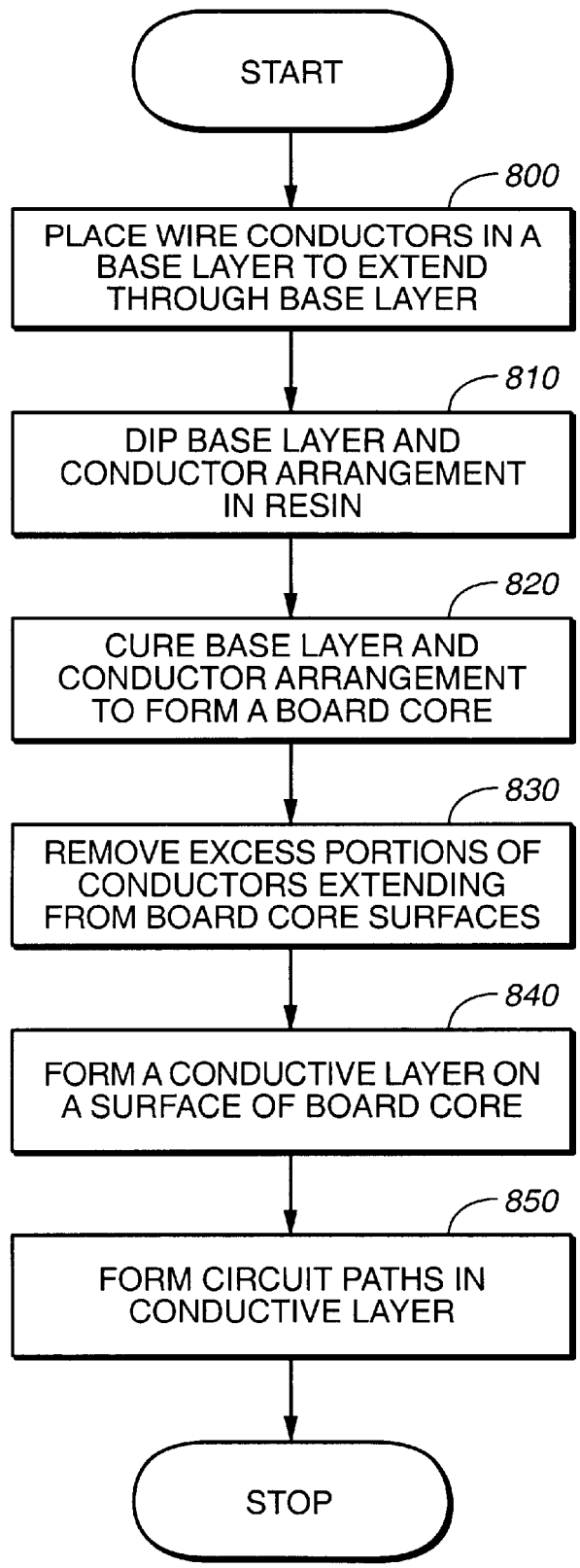
FIG._8

METHOD FOR MAKING ELECTRICAL INTERCONNECTIONS BETWEEN LAYERS OF AN IC PACKAGE

BACKGROUND OF THE INVENTION

1. Field of the Invention

This invention relates generally to semiconductor Integrated Circuit (IC) package manufacturing, and more particularly, to a process for manufacturing Printed Circuit (PC) boards, wherein electrical interconnections are imbedded within the boards during their manufacture, thereby eliminating the need for mechanical drilling.

2. Description of the Related Art

It is desirable to provide electrical interconnection between different layers of an IC package. These electrical connections, or vias, are usually formed during the manufacturing process by mechanical drilling.

To manufacture a PC board, strands of fibers (e.g., glass) are woven together to form a sheet of cloth. This cloth is then dipped in resin and thermally cured forming a cured board core. Copper sheets or other conductive materials are then plated or otherwise formed on the board core. The copper sheets are eventually etched into circuit paths for electronic circuitry to form the PC board. Vias are commonly created by mechanically drilling holes through the copper sheets and board core, then plating conductive material along the side-walls of the drilled through-holes. This process is performed after the board core is cured.

The vias formed by mechanical drilling are the single most time consuming and expensive process step in IC package manufacturing. Cracks can occur during normal operation due to stresses produced by temperature cycling. These cracks are usually caused by poor drilling that results in uneven via side-walls. Also, the combination of materials used in the manufacture of a PC board (e.g., glass fibers and resin) is difficult to drill through smoothly and cleanly after curing.

Furthermore, to make IC packages smaller with increased density, the mechanically-drilled vias must be reduced in size. Unfortunately, the size of a drilled via is limited by the mechanical limitation of the drill-bit diameter. Ultra-small drill-bits are expensive to manufacture and the useful life is limited. Moreover, sufficient plating of the via side-walls becomes more difficult as the aspect ratio (i.e., the ratio between a via diameter and its length) increases.

Accordingly, there remains a need for a process by which electrical connections may be made between layers of an IC package without resorting to mechanical drilling.

SUMMARY OF THE INVENTION

Conductors are placed in a base layer so that the conductors extend through the base layer. The base layer is then dipped in curing material and cured to form a solid board core with the conductors extending through the board core (i.e., imbedded vias). After curing, portions of conductors extending from surfaces of the board core are removed so that the conductors are flush with board core surfaces. Copper sheets or other conductive material are then plated, or otherwise formed, on the surfaces of the board core making electrical connection with the imbedded vias. The copper sheets, or other conductive material, can then be etched in the form of circuit paths in alignment with imbedded vias and in conductive engagement with such vias to form the finished circuit board.

This eliminates defects caused by mechanical drilling and provides more reliable construction by replacing thinly-plated via side-walls with solid conductors. In addition, via hole diameters that were formerly constrained by the size of the drill-bit can now be significantly reduced. Finally, with the elimination of mechanical drilling, a significant decrease in production cycle time and cost can be achieved.

BRIEF DESCRIPTION OF THE DRAWINGS

FIG. 1A is a partial sectional view of a conventional board core for a PC board.

FIG. 1B is a partial sectional view of the board core in FIG. 1A including laminate copper sheets disposed on the board core surfaces.

FIG. 1C is a partial sectional view of the board core in FIG. 1B including mechanically drilled vias.

FIG. 1D is a partial sectional view of the board core in FIG. 1C including plated via side-walls.

FIG. 1E is a partial sectional view of the board core in FIG. 1D including circuit paths etched in the laminate copper sheets to form the finished PC board.

FIG. 2A is a partial sectional view of one embodiment of the inventive subject matter, wherein a base layer is attached to a fixture including wire conductors inserted therein.

FIG. 2B is a partial sectional view of one embodiment of the inventive subject matter, wherein the arrangement in FIG. 2A is dipped in resin and thermally cured forming a solid board core including excess portions of wire conductors extending from the board core surfaces.

FIG. 2C is a partial sectional view of one embodiment of the inventive subject matter, showing the arrangement in FIG. 2B with excess portions of wire conductors removed.

FIG. 2D is a partial sectional view of one embodiment of the inventive subject matter, wherein the arrangement in FIG. 2C includes laminate copper foil disposed on the board core surfaces and in electrical connection with the wire conductors.

FIG. 2E is a partial sectional view of one embodiment of the inventive subject matter, wherein the arrangement in FIG. 2D includes circuit paths etched in the laminate copper foil, wherein circuit paths are in alignment with positions of wire conductors to form the finished circuit board.

FIG. 3A is a partial sectional view of one embodiment of the inventive subject matter, wherein the conductors are removed from a cured board core having surfaces with laminate copper sheets disposed thereon, leaving holes extending through the copper sheets and the cured board core.

FIG. 3B is a partial sectional view of one embodiment of the inventive subject matter, wherein the holes shown in FIG. 3A are plated with conductive material using conventional techniques.

FIG. 3C is a partial sectional view of one embodiment of the inventive subject matter, wherein circuit paths are etched in the copper sheets to form the finished circuit board.

FIG. 4 is a partial sectional view of one embodiment of the inventive subject matter, wherein an IC package includes a composite comprising three stacked board cores with blind and buried imbedded vias therein.

FIG. 5 is a partial sectional view of one embodiment of the inventive subject matter, wherein an IC package includes a conventional board core and a redistribution core having fine imbedded vias for avoiding dense patterning in a flip-chip application.

FIG. 6 is a partial sectional view of one embodiment of the inventive subject matter, wherein a chip-scale IC package includes a board core with imbedded vias therein.

FIG. 7 is a partial sectional view of one embodiment of the inventive subject matter, wherein an IC package includes a board core having fine imbedded vias arranged in a dense pattern to form a thick conductor capable of providing electrical conduction with multiple imbedded vias in other layers of an IC package.

FIG. 8 is a flowchart illustrating one embodiment of the inventive subject matter, wherein imbedded vias are created without mechanical drilling.

DETAILED DESCRIPTION OF THE INVENTION

Referring to FIGS. 1A–1E, a set of partial sectional views illustrating a prior art process of manufacture that uses mechanical drilling and through-hole plating to form imbedded vias is shown. The prior art process begins with a cured board core 100 as shown in FIG. 1A. Next, laminate copper sheets 110 are laminated on the board core 100 surfaces as shown in FIG. 1B. Alternatively, copper or other conductive material is plated onto the board core 100 surfaces using conventional plating techniques. Following the formation of the surface laminates of copper sheets 110, holes 120 are mechanically drilled through the laminate copper sheets 110 and board core 100 as shown in FIG. 1C. Side-walls 130 of the holes 120 are then plated with conductive material 140 as shown in FIG. 1D. Finally, in FIG. 1E, circuit paths 150 are etched into the laminate copper sheets 110 using conventional techniques to form the finished circuit board.

The mechanical drilling of the holes 120 is a time consuming and expensive process step in IC package manufacturing. Cracks can occur during normal operation due to stresses produced by temperature cycling. These cracks are usually caused by poor drilling resulting in uneven via side-walls. Cracks may reduce the overall reliability of the IC package. Additionally, the combining and curing of traditional materials such as glass cloth and resin form a work piece that is difficult to drill through.

To make IC packages smaller with increased circuit density, the holes 120 must be reduced in size. Unfortunately, the size of holes 120 is limited by the diameter of drill-bits used during mechanical drilling. Ultra-small drill-bits are expensive to manufacture and the useful life is limited. Also, plating the side-walls 130 of the holes 120 becomes more difficult as the aspect ratio (i.e., the ratio between a via diameter and its length) increases.

Referring now to FIGS. 2A–2E, a set of partial sectional views illustrating one embodiment of the process of manufacture that overcomes the difficulties associated with mechanical drilling is shown. As shown in FIG. 2A, this process begins with a base layer 200, for example, of woven glass fibers, which is disposed about a fixture 210. The fixture 210 is used to arrange conductors 220 within the base layer 200 in a predetermined pattern. The number and density of conductors 220 placed within the base layer 200 may vary according to application requirements. Preferably, the conductors 220 are copper wires and are arranged in a symmetrical pattern (e.g., matrix or grid) in the base layer 200 as shown in FIG. 2A. The conductors 220 can be made of a variety of metals including, but not limited to, copper, silver, gold, aluminum, and tungsten. Other nonmetallic woven fibers (e.g., sheet plastic, ceramic, TEFLON) may also be used as a base layer of the solid board core to be formed about such base layer and conductors 220.

FIG. 2B is a partial sectional view of a board core 230 and conductors 220 formed by dipping the arrangement of base layer 200 and conductors 220 in a resin bath and applying conventional curing techniques such as thermal curing. The fixture 210 is used to keep the conductors in their predetermined pattern during the dipping process, and to provide a rigid handle for maneuvering the arrangement within the resin bath. Any excess portions 240 of conductors 220 extending from the board core 230 surfaces are removed so that the conductors 220 are made flush with the board core 230 surfaces. FIG. 2C is a partial sectional view of the board core 230 with excess portions 240 of conductors 220 removed. FIG. 2D is a partial sectional view of the board core 230 including a conductive layer 250 that is formed onto the surfaces of the board core 230 and in conductive engagement with conductors 220. Preferably, the conductive layer 250 is a laminate of copper foil. However, the conductive layer 250 may be made of a variety of metals including, but not limited to, copper, silver, gold, aluminum, and tungsten. Alternatively, the conductive layer 250 is plated onto the surfaces of the board core 230 using conventional plating techniques. FIG. 2E is a partial sectional view of the board core 230, conductors 220, conductive layer 250, and further including circuit paths 260 etched into the conductive layer 250 aligned with the positions of, and in conductive engagement with, the conductors 220 using conventional etching techniques.

Referring now to FIGS. 3A–3C, a set of partial sectional views illustrating another embodiment of a novel process of manufacture that overcomes the difficulties associated with mechanical drilling is shown. This process begins with a board core 230 with conductive layer 250 that is formed onto the surfaces of the board core 230. The conductors 220 are then removed from the board core 230, leaving holes 300 as shown in FIG. 3A. In FIG. 3B, the holes 300 are plated with conductive material 140 using standard through-hole plating techniques as illustrated in FIG. 1D. Also, in FIG. 3C, circuit paths 260 are etched into the conductive layer 250 using conventional techniques to form the finished circuit board.

Furthermore, it is not necessary in this embodiment to use conductors 220 to leave holes 300 in the board core 230. Any filament, for example, "TEFLON" threads, can be removed from the board core 230 to leave holes 300. This embodiment also provides a way to form holes in PC boards for mounting components without having to plate the through-holes for forming vias.

Referring now to FIGS. 4–7, a set of partial sectional views illustrating several embodiments of IC packages formed by a process of manufacture that overcomes the difficulties associated with mechanical drilling is shown.

In FIG. 4, an IC package 400 includes a composite 410 and a semiconductor die 420. This embodiment includes three PC board laminates 430 stacked one atop the other to form the composite 410. The composite 410 includes blind imbedded vias 440 and buried imbedded vias 450. Preferably, both types of vias are made of copper wires using the process illustrated in FIGS. 2A–2E. The blind imbedded vias 440 are formed in the top and bottom PC board laminates 430 and are misaligned with the positions of the buried imbedded vias 450 which are formed in the middle PC board laminate 430. Hence, the names "blind" and "buried." These vias are electrically connected through a conductive layer 455.

The semiconductor die 420 is mounted atop the composite 410, and is electrically connected to the blind imbedded vias 440 by wire bonds 460 which contact the composite 410 at contact pads 470. Conventional solder balls 480 are attached to the bottom of the composite 410 for forming connections of the IC package to external components (not shown).

In FIG. 5, an IC package 500 includes a conventionally processed board 510, a semiconductor die 420, and a redistribution core 520. In this particular embodiment, the semiconductor die 420 is attached to the redistribution core 520 by using conventional solder bumps 530. The redistribution core 520 includes fine imbedded vias 540 for avoiding the dense circuit patterning associated with, for example, flip-chip applications. Preferably, the fine imbedded vias 540 are constructed with copper wires using the process illustrated in FIGS. 2A–2E. In addition, the conventional board 510, including drilled and plated vias 550 which are in electrical contact with conventional solder balls 480 for connection with external circuitry, may be used to connect the redistribution core 520 with such external circuitry.

In FIG. 6, a chip-scale IC package 600 includes a core 610 and a semiconductor die 420. In this particular embodiment, the core 610 includes fine imbedded vias 540 which are in electrical connection with the solder bumps 530 which are, in turn, connected to the semiconductor die 420. Solder balls 480 are also attached to the core 610 and are used to connect the IC package 600 to external circuitry.

In FIG. 7, an IC package includes a laminate core 710 and build-up layers 720. In this particular embodiment, the laminate core 710 includes a plurality of fine imbedded vias 540, densely packed to form a composite thick conductor. The build-up layers 720 are built up on the laminate core 710 to form the IC package 700. Conventional plated vias 730 extend through the build-up layers 720 to the laminate core 710 and are in conductive engagement with a plurality of fine imbedded vias 540 to form a composite. The conventional plated vias 730 are photo defined or laser drilled, and plated using conventional techniques.

FIG. 8 is a flowchart illustrating a process for forming imbedded vias for electrical interconnection between the layers of an IC package without mechanical drilling. Preferably, conductors 220 are placed 800 in a base layer 200 using a fixture 210 to arrange the conductors 220 to extend through the base layer 200. The conductors 220 may be arranged symmetrically within the base layer 200 (e.g., matrix or grid pattern), or may be positioned selectively in alignment with a custom circuit pattern in one or more layers of conductive laminate. The arrangement of the base layer 200 and conductors 220 is then dipped 810 in resin and thermally cured 820 to form a board core 230 using conventional techniques. Next, excess portions of conductors 240 are removed 830 to form the conductors 220 flush with the board core 230 surfaces. At least one board core 230 surface is then plated 840, or otherwise processed, with a conductive layer 250, preferably copper, to form laminate sheets in conductive contact with the conductors 220. Finally, a circuit path 260 is etched 850 in the conductive layer 250 for conduction between electronic components to be disposed thereon.

What is claimed is:

1. A method of forming electrical interconnection between a first surface and a second surface of a board core, the first surface of the board core opposite the second surface of the board core, the board core comprising a base layer, the base layer having a first surface and a second surface opposite the first surface, the interconnection being formed without mechanical drilling, the method comprising the steps of:

placing conductors through the base layer to extend from the first surface of the base layer through the base layer to the second surface of the base layer, wherein the conductors are in the form of filaments;

dipping the base layer in curing material;

curing the material to form the board core with the conductors extending from the first surface of the board core through the board core to the second surface of the board core; and forming a conductive layer on the first surface of the board core at least in regions of such surface adjacent the conductors and in electrical contact therewith.

2. The method of claim 1, further including the step of etching circuit paths in the conductive material to form a finished circuit board.

3. The method of claim 1, further including the step of removing excess portions of conductors extending from board core surfaces to form conductors extending substantially flush with board core surfaces.

4. The method of claim 1, wherein the base layer includes a nonmetallic material selected from the group consisting of glass, plastic, ceramic, and TEFLON.

5. The method of claim 1, further including the steps of:
   disposing the conductors on a fixture; and
   using the fixture to arrange the conductors within the base layer in a predetermined pattern.

6. A method of forming electrical interconnection between a first surface and a second surface of a board core, the first surface of the board core opposite the second surface of the board core, the board core comprising a nonmetallic base layer, the base layer having a first surface and a second surface opposite the first surface, the electrical interconnection being created without mechanical drilling, the method comprising the steps of:

placing conductors in the base layer to extend from the first surface of the base layer through the base layer to the second surface of the base layer;

dipping the base layer in curing material;

curing the base layer to form the board core;

removing portions of conductors extending from the first and second board core surfaces to form conductors flush with the first and second board core surfaces;

plating at least one of the board core surfaces with conductive material such that the conductive material is in conductive engagement with the conductors;

forming circuit paths in the conductive material;

disposing electrical components on the conductive material, thereby creating a conductive path between each of the electrical components and a corresponding one of the conductors.

7. The method of claim 1, wherein the base layer containing the conductors is dipped in resin in liquid state and thermally cured to solid state.

8. The method of claim 1, wherein the conductive layer is formed of a metal selected from the group consisting of copper, silver, gold, aluminum, and tungsten.

9. The method of claim 2, further including the step of stacking a plurality of finished circuit boards to form a composite circuit board including at least one conductor forming a buried imbedded via.

10. The method of claim 2, further including the step of stacking a plurality of finished circuit boards to form a composite circuit board including at least one conductor forming a blind imbedded via.

11. The method of claim 2, wherein the finished circuit board forms a redistribution core having conductors therein for electrical connection with a semiconductor die.

12. The method of claim 1, further including the step of placing the conductors within the base layer with sufficient density to form a composite thick conductor through the board core.

13. The method of claim 12, further including the step of forming build-up layers on the board core surfaces in electrical contact with the composite thick conductor therein.

14. The method of claim 1, wherein the conductive layer is plated onto a surface of the board core.

15. The method of claim 1, wherein the conductive layer is laminated onto a surface of the board core.

16. A method of forming electrical interconnection between a first surface and a second surface of a board core, the first surface of the board core opposite the second surface of the board core, the board core, comprising a nonmetallic base layer, the base layer having a first surface and a second surface opposite the first surface, the electrical interconnection being created without mechanical drilling, the method comprising the steps of:

placing conductors in the base layer to extend from the first surface of the base layer through the base layer to the second surface of the base layer, wherein the conductors are in the form of filaments;

dipping the base layer in curing material;

curing the base layer to form the board core;

removing portions of conductors extending from the first and second board core surfaces to form conductors flush with the first and second board core surfaces;

plating at least one of the board core surfaces with conductive material such that the conductive material is in conductive engagement with the conductors;

forming circuit paths in the conductive material;

disposing electrical components on the conductive material, thereby creating a conductive path between each of the electrical components and a corresponding one of the conductors.

17. A method for forming electrical interconnection between layers of an electrical circuit board without mechanical drilling, comprising the steps of:

placing filaments through a base layer to extend through the base layer;

dipping the base layer in curing material;

curing the material to form a solid board core with the filaments extending through the board core;

forming a conductive layer on a surface of the board core at least in regions of such surface adjacent the filaments; and removing the filaments to leave finished holes extending through the board core.

18. The method of claim 17, further including the step of plating the finished holes with conductive material.

19. The method of claim 18, further including the steps of forming circuit paths in the conductive layer in electrical connection with the conductive material plated in the finished holes.

* * * * *